(12) United States Patent
Xu et al.

(10) Patent No.: US 11,374,103 B2
(45) Date of Patent: Jun. 28, 2022

(54) GATE STRUCTURE AND PHOTOMASK OF NAND MEMORY AND METHOD FOR MAKING THE SAME

(71) Applicant: SHANGHAI HUALI MICROELECTRONICS CORPORATION, Shanghai (CN)

(72) Inventors: Pengkai Xu, Shanghai (CN); Fulong Qiao, Shanghai (CN); Yi Wang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 16/837,961

(22) Filed: Apr. 1, 2020

(65) Prior Publication Data
US 2021/0193810 A1 Jun. 24, 2021

(51) Int. Cl.
| | |
|---|---|
| *H01L 29/423* | (2006.01) |
| *H01L 27/11524* | (2017.01) |
| *H01L 27/11529* | (2017.01) |
| *H01L 27/1157* | (2017.01) |
| *H01L 21/28* | (2006.01) |
| *H01L 27/11539* | (2017.01) |
| *H01L 27/11541* | (2017.01) |
| *H01L 29/66* | (2006.01) |
| *H01L 29/788* | (2006.01) |

(52) U.S. Cl.
CPC .. *H01L 29/42328* (2013.01); *H01L 27/11524* (2013.01); *H01L 27/11529* (2013.01); *H01L 27/11539* (2013.01); *H01L 27/11541* (2013.01); *H01L 29/40114* (2019.08); *H01L 29/66825* (2013.01); *H01L 29/788* (2013.01)

(58) Field of Classification Search
CPC ......... H01L 29/42328; H01L 27/11524; H01L 27/11529; H01L 27/11539; H01L 27/11541; H01L 29/40114; H01L 29/66825; H01L 29/788; H01L 27/1157; H01L 21/28008; H01L 27/11521; H01L 27/11568; H01L 29/42356
See application file for complete search history.

(56) References Cited

U.S. PATENT DOCUMENTS

| | | | |
|---|---|---|---|
| 8,202,683 B2 * | 6/2012 | Lee | ...................... H01L 21/0337 430/313 |
| 9,911,736 B1 | 3/2018 | Zang et al. | |
| 2020/0013896 A1 | 1/2020 | Xu et al. | |

* cited by examiner

*Primary Examiner* — David Vu
(74) *Attorney, Agent, or Firm* — Alston & Bird LLP

(57) ABSTRACT

A method for forming the gate structure of the NAND memory, comprising the steps of disposing a gate structure layer, a pattern transfer layer, a TEOS structure, and an organic dielectric Tri-Layer on a substrate sequentially; performing a patterning using a first photomask and a first photoresist layer; performing an etching process to form a control gate structure, a peripheral gate structure and a select gate structure; performing a trimming process to them; patterning sidewalls on sides of them; performing a second patterning using a second photomask as a mask and a second photoresist layer to protect the peripheral gate structure, the select gate structure, and their sidewalls; removing the control gate structure between its sidewalls; performing etching by using the sidewalls, the peripheral gate structure and the select gate structure as masks to form the control gate, the peripheral gate, and the select gate.

14 Claims, 5 Drawing Sheets

GATE STRUCTURE AND PHOTOMASK OF NAND MEMORY AND METHOD FOR MAKING THE SAME

CROSS-REFERENCES TO RELATED APPLICATIONS

This application claims priority to Chinese patent application No. CN201911314216.4, filed at CNIPA on Dec. 19, 2019, and entitled "GATE STRUCTURE AND PHOTOMASK OF NAND MEMORY AND METHOD OF MAKING THE SAME", the disclosure of which is incorporated herein by reference in entirety.

TECHNICAL FIELD

The present disclosure relates to the field of semiconductor integrated circuits, in particular to NAND memory devices.

BACKGROUND

NAND memory is a kind of nonvolatile memories in semiconductor integrated circuits because of its large capacity, fast rewriting speed, low cost and other advantages. NAND is applicable to data storage and is widely used in the fields of consumer electronics, automobile, industrial electronics, and so on.

FIG. 1 is a schematic block diagram of one block of an NAND memory. As illustrated in FIG. 1, an NAND memory usually includes a number of storage transistors (control transistors) in series in a storage area and a peripheral area. The peripheral area includes a plurality of peripheral transistors. The storage area includes a plurality of blocks of storage transistors. Each block has two select transistors and a plurality of control transistors. The two select transistors are located at the two ends of the block, and the control transistors are located between the select transistors of the block. With the development of technology, the size of the control gates continuously shrink to meet the growing demand of storage capacity. However, it brings many technical problems. To improve the utilization ratio of the memory area and to improve the process window of the memory products have been the focus of the research of IC industry.

When the pitch of the NAND memory steps under 40 nm note, especially 20 nm or less, in order to realize smaller critical dimension of the storage unit, self-aligned double patterning (SADP) technology has been used when patterning the storage area. This SADP technology has been used in the fin layers of the FinFET device and the critical layers in manufacturing process of the NAND memory, so as to improve the density of patterns on the chip and realize smaller pitch of patterning. The basic principle of self-aligned double patterning technology is to decompose a set of circuit patterns into two sets of patterns, usually including a key pattern with high density and a non-key pattern with relatively lower density, and then patterning is respectively performed, so as to improve the quality of patterning. At present, in the application of self-aligned double patterning technology, the process mainly comprises the following steps: firstly manufacturing a high-density pattern, wherein the high-density key pattern is usually obtained by adopting a sidewall transfer technology, specifically, a first-pass pattern is formed in photoresist by using a mask, then the first-pass pattern is transferred to a top mask layer by adopting an etching process, and the pattern with the required size is obtained by adopting an etch trimming process; then, manufacturing sidewalls on sidewalls of the top mask layer with the first-pass pattern by adopting a deposition process and an etching process, and removing the top mask layer; then, depositing a photoresist layer again, and after the low-density pattern is formed by adopting another mask, performing etching by using the remaining sidewalls and the photoresist as a mask layer. The area finally defined by the sidewall structure is the high-density key pattern, while the pattern finally defined by the photoresist is the low-density pattern.

However, in the sidewall etching process, the pattern density of the sidewalls on the outer side is different from that of the sidewalls on the inner side, so the critical dimension will be different due to the influence of Iso/Dense loading effect, resulting in the problem that the critical dimensions of the control gates are different, e.g., the critical dimension of the control gates on the outer side is larger. In addition, there will be an interlayer alignment deviation during photolithography. As a result, the spacing between the control gate and the select gate is uneven, larger or smaller, which will influence the subsequent processes such as etching and chemical mechanical polishing, and reduce the overall process window of the NAND memory.

BRIEF SUMMARY

According to some embodiments in this application, a method for manufacturing a gate structure of the NAND memory is disclosed in the following steps: S1: providing a substrate, disposing a gate structure layer, a pattern transfer layer, a tetraethyl orthosilicate (TEOS) structure, and an organic dielectric Tri-Layer on the substrate sequentially; S2: performing a first-pass photolithography process by using a first photomask and a first photoresist layer in the organic dielectric Tri-Layer; S3: performing an etching process to the organic dielectric Tri-Layer and the TEOS structure, removing the organic dielectric Tri-Layer to form a control gate structure, a peripheral gate structure and a select gate structure; S4: performing a trimming process to the control gate structure, the peripheral gate structure, and the select gate structure; S5: patterning sidewalls on sides of the control gate structure, the peripheral gate structure, and the select gate structure; S6: performing a second-pass photolithography process by using a second photomask as a mask and a second photoresist layer to protect the peripheral gate structure, the select gate structure, and the sidewalls on sides of the peripheral gate structure and the select gate structure; S7: removing the control gate structure between its sidewalls; and S8: performing etching by using the sidewalls, the peripheral gate structure and the select gate structure as masks to form the control gate, the peripheral gate, and the select gate.

In some cases, the gate structure layer comprises a silicon oxide layer, a floating gate layer, a silicon oxide layer-silicon nitride-silicon oxide layer, and a control gate layer.

In some cases, the pattern transfer layer comprises a silicon nitride layer, a silicon oxide layer, and an amorphous silicon layer.

In some cases, the TEOS structure comprises a silicon oxide film layer comprising a TEOS layer and a high-temperature oxide layer.

In some cases, the organic dielectric Tri-Layer comprises an organic dielectric layer, a silicon-containing anti-reflection layer and the first photoresist layer.

In some cases, in step S3, each of a width of the peripheral gate structure and a width of the select gate structure is larger than a width of the control gate structure.

In some cases, in step S3, the select gate structure is adjacent to the control gate structure.

In some cases, in step S4, each of the width of the control gate structure, the width of the peripheral gate structure and the width of the select gate structure is reduced.

In some cases, in step S5, the sidewalls of the select gate structure is adjacent to the sidewalls of the control gate structure.

In some cases, in step S6, the second photoresist layer is patterned to be only on the peripheral gate structure, the select gate structure, and the sidewalls on sides of the peripheral gate structure and the select gate structure.

In some cases, the widths of all sidewall structures of the control gate structures are the same.

According to another embodiment, an NAND memory, comprising a control gate, a select gate and a peripheral gate fabricated by adopting the method for forming the gate structure of the NAND memory described above.

According to another embodiment, a set of photomasks, applied to a process for forming a gate structure of an NAND memory, wherein the gate structure of the NAND memory comprises a control gate structure, a select gate structure, and a peripheral gate structure, wherein the set of photomasks comprises:

a first photomask in a first-pass photolithography process which applies a first photoresist, the first photomask comprising patterns of the control gate structure, a pattern of the select gate structure, a pattern of the peripheral gate structure, and a non-pattern area, wherein the first photomask generates the control gate structure, the peripheral gate structure, and the select gate structure on a first photoresist layer; and a second photomask in a second-pass photolithography process applying a second photoresist, the second photomask comprising a pattern of the peripheral gate structure and a pattern of the select gate structure, and a non-pattern area, wherein the peripheral gate structure and the select gate structure are protected by the second photoresist from etch.

In some examples, a space between two adjacent patterns of the control gate structure is the same and a width of each of the patterns of the control gate structure is the same.

In some examples, a width of the pattern of the peripheral gate structure and a width of the pattern of the select gate structure each is larger than the width of each of the pattern of the control gate structures.

In some examples, the pattern of the select gate structure is adjacent to one of the pattern of the control gate structures.

DESCRIPTION OF REFERENCE SIGNS OF MAIN COMPONENTS IN SELECTED DRAWINGS 510, 520, 540: core pattern;
530: non-pattern area

DETAILED DESCRIPTION OF THE DISCLOSURE

The technical solution of the present disclosure will be clearly and completely described below with reference to the drawings. Obviously, the described embodiments are part of the embodiments of the present disclosure, instead of all of them. Based on the embodiments in the present disclosure, all other embodiments obtained by one skilled in the art without contributing any inventive labor shall fall into the protection scope of the present disclosure.

Figure 1:
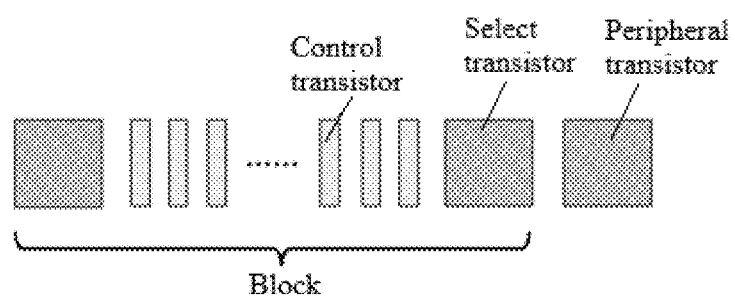
FIG. 1 is a schematic block diagram of an NAND memory.
Figure 2A:
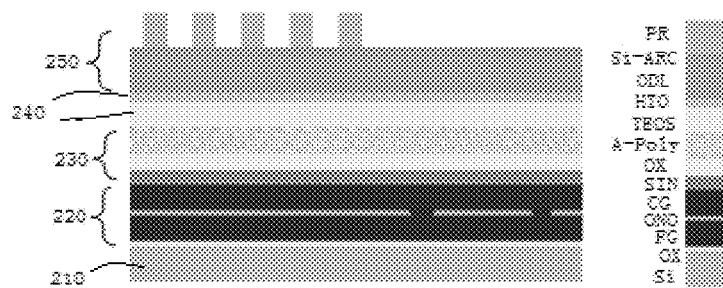
FIGS. 2a-2g illustrate cross sectional views of the NAND device after each of the steps in a manufacturing process for the conventional NAND memory.

Specifically, refer to FIGS. 2a-2g, which illustrate cross sectional views of the NAND device after each of the steps in a manufacturing process for the conventional NAND memory. As illustrated in FIG. 2a-2g, the process for manufacturing the NAND memory comprises the following steps:

S1: providing a substrate 210, and sequentially forming a gate structure layer 220, a pattern transfer layer 230, a TEOS structure 240 and an organic dielectric Tri-Layer 250 on the substrate 210, as illustrated in FIG. 2a.

Figure 3A:
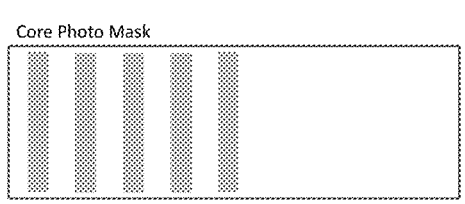
FIG. 3a is a line-space pattern in a conventional photomask.

S2: performing a first-pass photolithography and exposure process by using a photomask illustrated in FIG. 3a to form a core pattern (Core) morphology on a photoresist (PR) layer, as illustrated in FIG. 2a.

Figure 2B:
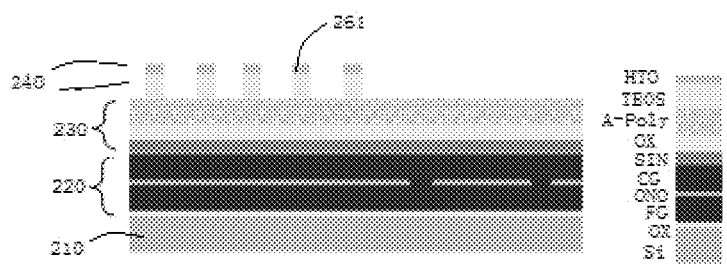

S3: under the pattern morphology of the photoresist illustrated in FIG. 2a, performing etching process to the organic dielectric Tri-Layer 250 and the TEOS structures 240 to form a core pattern (Core) structure 261 which has two layers as illustrated in FIG. 2b.

Figure 2C:
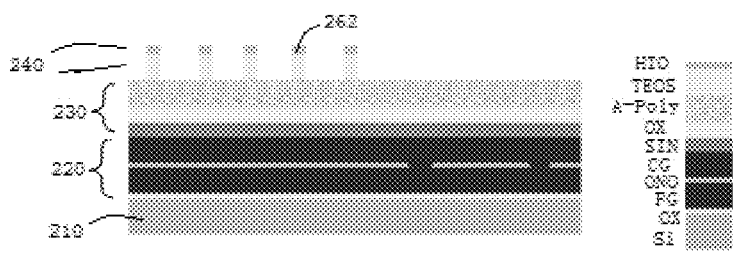

S4: since the critical dimension of the core pattern (Core) 261 illustrated in FIG. 2b is restricted of the photolithography process, reducing the critical dimension of the core pattern (Core) 261 in FIG. 2b by a trimming process to form a core pattern (Core) structure 262 as illustrated in FIG. 2c.

Figure 2D:
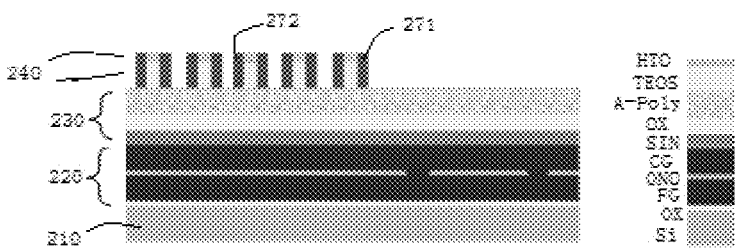

S5: performing sidewall structure deposition around the core pattern (Core) structure 262 in FIG. 2c, and then forming a core pattern structure with sidewalls 271 and 272 illustrated in FIG. 2d through sidewall etching process.

Figure 2E:
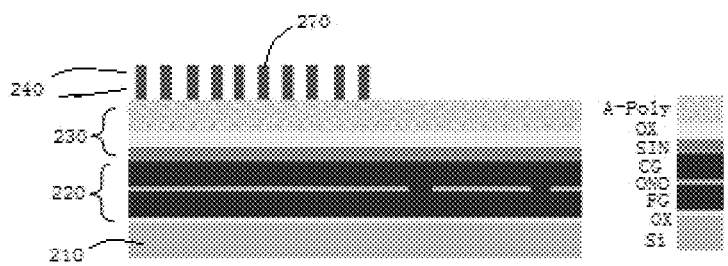

S6: performing a removing process to the core pattern structure 262 to form a sidewall structure 270 illustrated in FIG. 2e.

Figure 2F:
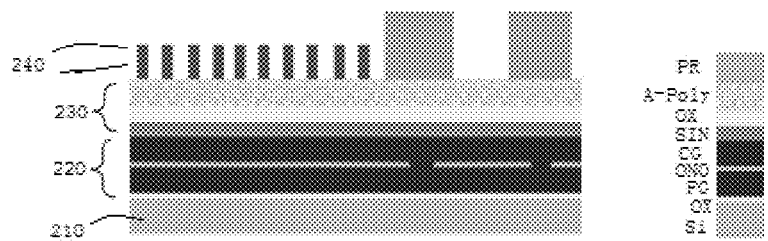
Figure 3B:
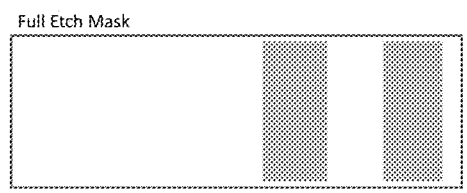
FIG. 3b is another line-space pattern in a conventional photomask.

S7: coating photoresist again, performing a second-pass photolithography and exposure process by using a photomask illustrated in FIG. 3b, wherein the area corresponding to a control gate (CG) has no photoresist remaining after the second-pass photolithography, and the areas corresponding to a select gate (SG) and a peripheral gate (PG) still have photoresist remaining, as illustrated in FIG. 2f.

Figure 2G:
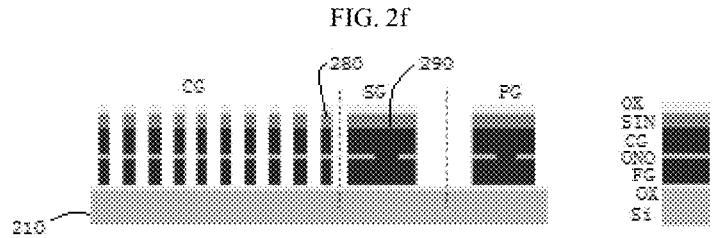

S8: performing an etching process under the structure in FIG. 2f, wherein the sidewalls 270 is used as an initial mask layer for etching the control gate. The remaining photoresist illustrated in FIG. 2f is used as an initial mask layer for etching to finally form a plurality of control gate (CG)

structures, a select gate (SG) structure and a peripheral gate (PG) structure illustrated in FIG. 2g.

As illustrated in FIG. 3a and FIG. 3b, the pattern area is an opaque area and the non-pattern area is a non-opaque area in the photomask, which are respectively used to form the photoresist pattern morphology illustrated in FIG. 2a to FIG. 2f.

In the above process flow, the critical dimension of the core pattern (Core) structure 262 defines the width of the spacing between the control gates, so it is necessary to perform the step of trimming process to the size of the core pattern, i.e., step S4, to make the width of the spacing between the control gates meet the process requirements. The thickness of the sidewall structures formed in step S6 the sidewall 271 on the most outer side is an isolated pattern (ISO), and the rest of the sidewalls 272 on the inner side each is a dense pattern (Dense). The Iso/Dense loading effect keeps the width of the sidewall 271 on the outer side larger than the width of the inside sidewalls 272, as a result influencing the uniformity of the device performance. To solve this problem, the control gate 280 adjacent to the select gate SG is usually built into a dummy gate, which does not play a real role like data storage. However, dummy gates decrease the utilization ratio of the product. In addition to the above disadvantages, in the above process, the select gate 290 is patterned in the photoresist during second-pass photolithography in step S7, it is subject to interlayer overlay alignment deviations in the photolithography process in step S2 and step S7, the space between the outermost control gate 280 and the select gate 290 can be out of the required dimension, which influences subsequent filling, chemical mechanical polishing and other processes. As a result, the process window of the NAND memory is reduced.

If the above problems, i.e., loading effects and interlayer alignment deviations can be solved, the utilization ratio of the area of the memory product will improve and the process window of the memory product will broaden.

Figure 4A:
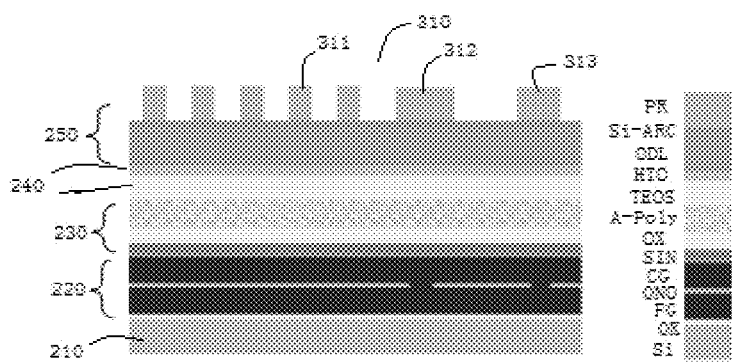
FIGS. 4a-4g illustrate the cross sectional views of the NAND device after each of the steps in a manufacturing process for forming a gate structure of an NAND memory according to one embodiment of the present disclosure.

In one embodiment of the present disclosure, the present disclosure provides a method for forming a gate structure of an NAND memory. Specifically, referring to FIGS. 4a to 4g, which illustrates the cross sectional views of the NAND memory after each of the steps in the process for forming the gate structure, according to one embodiment of the present disclosure. The method comprises the following steps:

In step S1, a substrate 210 is provided, and a gate structure layer 220, a pattern transfer layer 230, a TEOS structure 240 and an organic dielectric Tri-Layer 250 are sequentially formed on the substrate 210, as illustrated in FIG. 4a.

In one embodiment of the present disclosure, the substrate 210 may be a silicon (Si) substrate, a germanium (Ge) substrate, a silicon-germanium (SiGe) substrate, a silicon on insulator (SOI) substrate, or the like.

In one embodiment of the present disclosure, the gate structure layer 220 comprises a silicon oxide (OX) layer, a floating gate layer (FG), a silicon oxide layer-silicon nitride-silicon oxide layer (ONO), and a control gate layer.

In one embodiment of the present disclosure, the pattern transfer layer 230 comprises a silicon nitride layer (SiN), a silicon oxide layer (OX) and an amorphous poly-silicon layer (A-Poly).

In one embodiment of the present disclosure, the TEOS structure 240 comprises a silicon oxide film layer formed by tetraethyl orthosilicate (TEOS) which has molecular formula $Si(OC_2H_5)_4$ and a high-temperature oxide deposition layer (HTO).

In one embodiment of the present disclosure, the organic dielectric Tri-Layer 250 comprises an organic dielectric layer (ODL), a silicon-containing anti-reflection layer (Si-ARC) and a photoresist layer (PR).

In step S2, a first-pass photolithography and exposure process is performed by using a first photomask as a mask to form a core pattern (Core) morphology 310 on the photoresist layer of the organic dielectric Tri-Layer 250, wherein the core pattern (Core) morphology 310 comprises a core pattern morphology for forming a control gate structure 311, a core pattern morphology for forming a peripheral gate structure 313 and a core pattern morphology for forming a select gate structure 312, as illustrated in FIG. 4a.

Further, in one embodiment of the present disclosure, the core pattern morphology for forming the select gate structure 312 is adjacent to the core pattern morphology for forming the control gate structure 311.

In one embodiment of the present disclosure, the width of the core pattern morphology for forming the peripheral gate structure 313 and the width of the core pattern morphology for forming the select gate structure 312 are larger than the width of the core pattern morphology for forming the control gate structure 311.

Figure 4B:
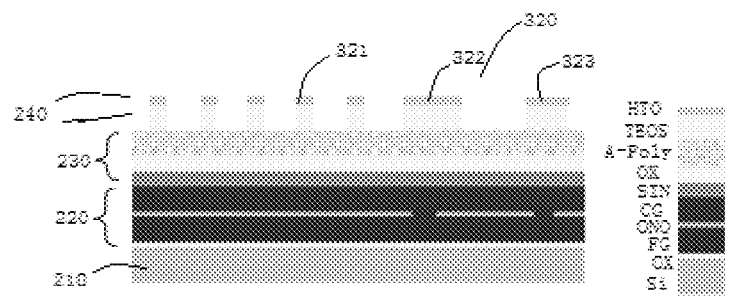

In step S3, under the core pattern morphology 310 formed in step S2, an etching process is performed to the organic dielectric Tri-Layer 250 and the TEOS structure 240, and the organic dielectric Tri-Layer 250 is removed to form a core pattern structure 320, wherein the core pattern structure 320 comprises a core pattern structure for forming the control gate structure 321, a core pattern structure for forming the peripheral gate structure 323 and a core pattern structure for forming the select gate structure 322, as illustrated in FIG. 4b.

Further, in one embodiment of the present disclosure, the width of the core pattern structure for forming the peripheral gate structure 323 and the width of the core pattern structure for forming the select gate structure 322 are larger than the width of the core pattern structure for forming the control gate structure 321.

Further, in one embodiment of the present disclosure, the core pattern structure for forming the select gate structure 322 is adjacent to the core pattern structure for forming the control gate structure(s) 321.

In one embodiment of the present disclosure, the etching process is a dry etching process. Further, in one embodiment of the present disclosure, the amorphous poly-silicon layer (A-Poly) is an etch stop layer in the etching process.

Figure 4C:
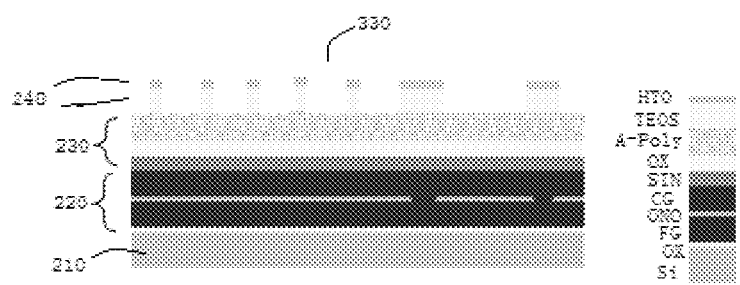

In step S4, the critical dimension of the core pattern structure 320 formed in step S3 is reduced through a trimming process to form a core pattern structure 330 which is smaller in width, as illustrated in FIG. 4c.

In one embodiment of the present disclosure, the width of the core pattern structure for forming the control gate structure 321, the core pattern structure for forming the peripheral gate structure 323 and the core pattern structure for forming the select gate structure 322 are all reduced.

In the present embodiment of the present disclosure, the trimming process is wet etching process.

Figure 4D:
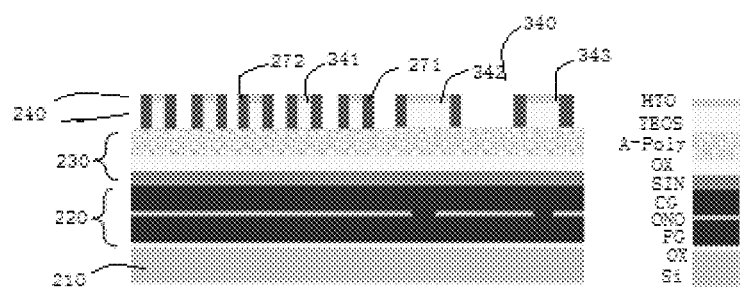

In step S5, a sidewall deposition process is performed around the core pattern structure 330 formed in step S4, and then a core pattern structure with sidewalls 340 is formed through a sidewall etching process, wherein the core pattern structure with sidewalls 340 comprises a core pattern structure with sidewalls for forming the control gate structures 341, a core pattern structure with sidewalls for forming the peripheral gate structure 343 and a core pattern structure with sidewalls for forming the select gate structure 342, as illustrated in FIG. 4d.

Further, in one embodiment of the present disclosure, the core pattern structure with sidewalls for forming the select gate structure 342 is adjacent to the core pattern structure with sidewalls for forming the control gate structures 341.

As illustrated in FIG. 4d, when the sidewall etching process is performed, the most outer side sidewall 271 in FIG. 2d for forming the control gate is no longer an isolated pattern as in step S5 in some current process. Since the core pattern morphology for forming the control gate structure 311 and the core done in the first-pass photolithography and exposure process in the present disclosure, the proximity structures of the sidewall 271 of the most outer side in the etching process is changed, i.e., the sidewall 271 on the most outer side and the sidewalls 272 on the inner side are all dense patterns, thus avoids the influence of the loading effect during the etching, makes the width of the sidewall of the most outer side and the width of the sidewalls on the inner side uniform, thus makes the device performance consistent. At the same time, it also avoids the problem of having the gate adjacent to the control gate used as a dummy gate, thereby improving the utilization area ratio of the product.

Figure 4E:
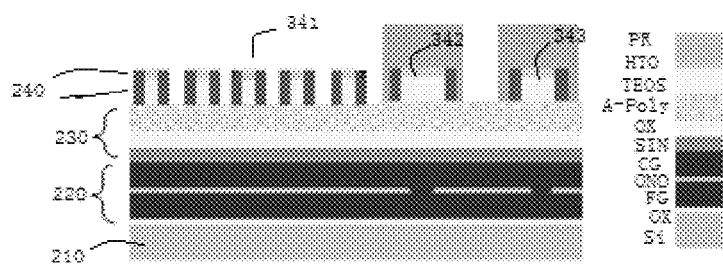

In step S6, a second-pass photolithography and exposure process is performed by applying a second photomask, so as to enable the photoresist to cover the core pattern structure with sidewalls for forming the select gate structure 342 and the core pattern structure with sidewalls for forming the peripheral gate structure 343, and to develop the photoresist in the area of the core pattern structure with sidewalls for forming the control gate structure 341, as illustrated in FIG. 4e.

Further, in one embodiment of the present disclosure, the photoresist only covers the area of the core pattern structure with sidewalls for forming the peripheral gate structure 343 and the area of the core pattern structure with sidewalls for forming the select gate structure 342.

Figure 4F:
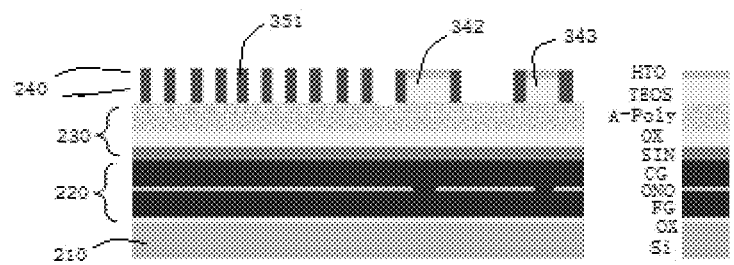

In step S7, the core structure in the core pattern structure with sidewalls for forming the control gate structure 341 is removed by using the photoresist formed in step S6 as a mask, and then the photoresist formed in step S6 is removed to form sidewall structures in order to form the control gate structure 351, the core pattern structure with sidewalls for forming the select gate structure 342 and the core pattern structure with sidewalls for forming the peripheral gate structure 343, as illustrated in FIG. 4f.

As illustrated in FIG. 4f, the core structure in the core pattern structure with sidewalls for forming the peripheral gate structure 343 and the core pattern structure with sidewalls for forming the select gate structure 342 still remain.

Further, in one embodiment of the present disclosure, the widths of all sidewall structures for forming the control gate structures 351 are the same. Of course, there may be some process variations among the widths of the sidewall structures for forming the control gate structure 351, but the variation shall be in an acceptable range of the process and within a predetermined tolerance.

Further, in one embodiment of the present disclosure, the core patterns are removed through a wet process.

Figure 4G:
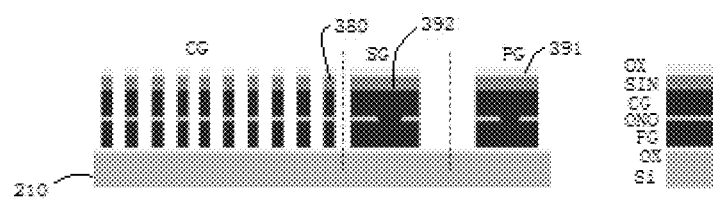

In step S8, etching is performed by using the sidewall structures for forming the control gate structure 351, the core pattern structure with sidewalls for forming the peripheral gate structure 343 and the core pattern structure with sidewalls for forming the select gate structure 342 formed in step S7 as a mask layer to form the control gate structure (CG) 380, the peripheral gate structure (PG) 391 and the select gate structure (SG) 392, as illustrated in FIG. 4g.

In the process for forming the gate structure of the NAND memory, when a core pattern morphology for a control gate structure is formed through a first-pass photolithography and exposure process, a core pattern morphology for forming a peripheral gate structure and a core pattern morphology for forming a select gate structure are performed at the same time, when a core pattern structure for forming the control gate structure is formed, the core pattern structures for forming the peripheral gate structure and the select gate structure are made at the same time, followed by performing the deposition and etching processes of the sidewalls. After that, in the process of removing the core pattern structure through a second-pass photolithography and exposure process, the area for forming the peripheral gate and the select gate structure is protected by using photoresist. In the subsequent etching of the gate structure, the control gate is still formed through the remaining sidewalls, and the peripheral gate and the select gate are formed jointly through the sidewalls and the core pattern structure which is not removed, such that the outermost sidewalls for forming the control gate are no longer isolated pattern, and the critical dimension is not larger. In addition, since the second photolithography and exposure process is not used to form a pattern, the interlayer alignment deviation will not change the space between the control gate and the peripheral gate, and its influence on the subsequent process is weakened.

In one embodiment of the present disclosure, the present disclosure further provides an NAND memory, which comprises a control gate, a select gate and a peripheral gate fabricated by adopting the method for forming the gate structure of the NAND memory described above.

In one embodiment of the present disclosure, the present disclosure further provides a photomask used in a process for forming a gate structure of an NAND memory. The gate structure of the NAND memory comprises a control gate structure 380, a select gate structure 392 and a peripheral gate structure 391 illustrated in FIG. 4g.

Figure 5A:
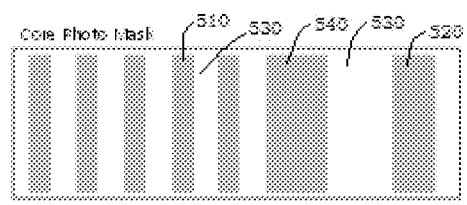
FIG. 5a is a pattern of a first photomask in a process for forming the gate structure of the NAND memory according to one embodiment of the present disclosure.
Figure 5B:
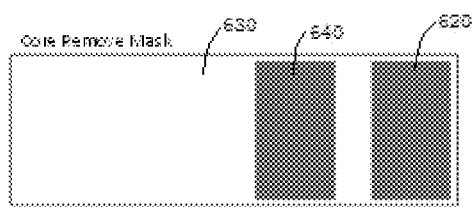
FIG. 5b is the pattern on a second photomask in the process for forming the gate structure of the NAND memory according to one embodiment of the present disclosure.

Referring to FIG. 5a and FIG. 5b, FIG. 5a shows patterns of a first photomask in a process for forming a gate structure of an NAND memory according to one embodiment of the present disclosure. FIG. 5b shows patterns of a second photomask in a process for forming a gate structure of an NAND memory, according to one embodiment of the present disclosure. Specifically, the photomasks used in the process for forming the gate structure of the NAND memory comprises: a first photomask, as shown in FIG. 5a, and the second photomask as shown in FIG. 5b. The first photomask comprises control gate structure core patterns 510, a peripheral gate structure core pattern 520, a select gate structure core pattern 540 and a non-pattern area 530 outside the area containing the core patterns, such that after a first-pass photolithography and exposure process is performed by using the first photomask as a mask, a core pattern morphology for forming a control gate structure 311, a core pattern morphology for forming a peripheral gate structure 313 and a core pattern morphology for forming a select gate structure 312 are formed on a photoresist layer, as illustrated in FIG. 4a. The second photomask comprises a pattern area 620 covering a peripheral gate structure pattern, a pattern area 640 covering a select gate structure pattern and a non-pattern area 630 outside the pattern areas, such that after a second-pass photolithography and exposure process is performed by using the second photomask as a mask, the photoresist covers the area of the pattern for forming the peripheral gate structure and the area of the pattern for forming the select gate structure, and the photoresist in other areas is developed, as illustrated in FIG. 4e.

Further, in one embodiment of the present disclosure, the spacing between the control gate structure core patterns 510 in the first photomask is equal and the size of the control gate structure core patterns 510 is the same. Further, in one embodiment of the present disclosure, the width of the core formed by using the peripheral gate structure core pattern 520 and the width of the core formed by using the select gate structure core pattern 540 are larger than the width of the cores formed by using the control gate structure core patterns 510. Further, in one embodiment of the present disclosure, the select gate structure core pattern 540 is adjacent to the control gate structure core patterns 510.

Finally, it should be noted that the above embodiments are only used for describing the technical solutions of the present disclosure, instead of limiting the technical solutions. Although the present disclosure is described in detail with reference to the above embodiments, it should be understood by one skilled in the art that the technical solutions recorded in the above embodiments may still be modified, or some or all of the technical features may be replaced equivalently. These modifications or replacements do not make the essence of the corresponding technical solution deviate from the scope of the technical solutions of the embodiments of the present disclosure.

What is claimed is:

1. A method for manufacturing a gate structure of an NAND memory, comprising the steps of:
    S1: providing a substrate, disposing a gate structure layer, a pattern transfer layer, a tetraethyl orthosilicate (TEOS) structure, and an organic dielectric Tri-Layer on the substrate sequentially;
    S2: performing a first-pass photolithography process by using a first photomask and a first photoresist layer in the organic dielectric Tri-Layer;
    S3: performing an etching process to the organic dielectric Tri-Layer and the TEOS structure, removing the organic dielectric Tri-Layer to form a control gate structure, a peripheral gate structure and a select gate structure;
    S4: performing a trimming process to the control gate structure, the peripheral gate structure, and the select gate structure;
    S5: patterning sidewalls on sides of the control gate structure, the peripheral gate structure, and the select gate structure;
    S6: performing a second-pass photolithography process by using a second photomask as a mask and a second photoresist layer to protect the peripheral gate structure, the select gate structure, and the sidewalls on sides of the peripheral gate structure and the select gate structure;
    S7: removing the control gate structure between its sidewalls; and
    S8: performing etching by using the sidewalls, the peripheral gate structure and the select gate structure as masks to form the control gate, the peripheral gate, and the select gate.

2. The method for forming the gate structure of the NAND memory according to claim 1, wherein the gate structure layer comprises a silicon oxide layer, a floating gate layer, a silicon oxide layer-silicon nitride-silicon oxide layer, and a control gate layer.

3. The method for forming the gate structure of the NAND memory according to claim 1, wherein the pattern transfer layer comprises a silicon nitride layer, a silicon oxide layer, and an amorphous silicon layer.

4. The method for forming the gate structure of the NAND memory according to claim 1, wherein the TEOS structure comprises a silicon oxide film layer comprising a TEOS layer and a high-temperature oxide layer.

5. The method for forming the gate structure of the NAND memory according to claim 1, wherein the organic dielectric Tri-Layer comprises an organic dielectric layer, a silicon-containing anti-reflection layer and the first photoresist layer.

6. The method for forming the gate structure of the NAND memory according to claim 1, wherein in step S3, each of a width of the peripheral gate structure and a width of the select gate structure is larger than a width of the control gate structure.

7. The method for forming the gate structure of the NAND memory according to claim 1, wherein in step S3, the select gate structure is adjacent to the control gate structure.

8. The method for forming the gate structure of the NAND memory according to claim 6, wherein in step S3, each of the width of the peripheral gate structure and the width of the select gate structure is larger than the width of the control gate structure.

9. The method for forming the gate structure of the NAND memory according to claim 1, wherein in step S3, the select gate structure is adjacent to the control gate structure.

10. The method for forming the gate structure of the NAND memory according to claim 6, wherein in step S4, each of the width of the control gate structure, the width of the peripheral gate structure and the width of the select gate structure is reduced.

11. The method for forming the gate structure of the NAND memory according to claim 1, wherein in step S5, the sidewalls of the select gate structure is adjacent to the sidewalls of the control gate structure.

12. The method for forming the gate structure of the NAND memory according to claim 1, wherein in step S6, the second photoresist layer is patterned to be on the peripheral gate structure and the select gate structure.

13. The method for forming the gate structure of the NAND memory according to claim 6, wherein the widths of all sidewall structures of the control gate structures are the same.

14. An NAND memory, comprising a control gate, a select gate and a peripheral gate fabricated by adopting the method for forming the gate structure of the NAND memory according to claim 1.

* * * * *